United States Patent
Chen et al.

(10) Patent No.: US 8,586,981 B2
(45) Date of Patent: Nov. 19, 2013

(54) SILICON-ON-INSULATOR ("SOI") TRANSISTOR TEST STRUCTURE FOR MEASURING BODY-EFFECT

(75) Inventors: Qiang Chen, Sunnyvale, CA (US); Jung-Suk Goo, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1253 days.

(21) Appl. No.: 11/543,638

(22) Filed: Oct. 5, 2006

(65) Prior Publication Data

US 2008/0185581 A1    Aug. 7, 2008

(51) Int. Cl.
*H01L 29/10* (2006.01)

(52) U.S. Cl.
USPC .......................... 257/48; 257/E21.531; 438/18

(58) Field of Classification Search
USPC ............... 257/48, E21.531, E23.002; 438/18
See application file for complete search history.

(56) References Cited

U.S. PATENT DOCUMENTS

| | | | |
|---|---|---|---|
| 6,218,248 B1 * | 4/2001 | Hwang et al. | 438/294 |
| 2002/0109187 A1 * | 8/2002 | Matsumoto et al. | 257/347 |

* cited by examiner

*Primary Examiner* — Tucker Wright
(74) *Attorney, Agent, or Firm* — Farjami & Farjami LLP

(57) ABSTRACT

According to one exemplary embodiment, a silicon-on-insulator (SOI) transistor test structure includes a gate situated over a semiconductor body and a doped halo under the gate. The SOI transistor test structure further includes at least two semiconductor body contacts situated on opposing sides of the doped halo, where one or more of the at least two semiconductor body contacts forms a direct electrical contact with the doped halo, thereby increasing current flow to the doped halo to facilitate measuring body-effect in the SOI transistor test structure.

11 Claims, 5 Drawing Sheets

SILICON-ON-INSULATOR ("SOI") TRANSISTOR TEST STRUCTURE FOR MEASURING BODY-EFFECT

1. TECHNICAL FIELD

The present invention relates generally to the field of semiconductor devices. More particularly, the present invention is related to semiconductor device test structures.

2. BACKGROUND ART

The use of silicon-on-insulator ("SOI") transistors in integrated circuits is continuously increasing due to their high performance and low power consumption. As such, accurate modeling of SOI transistor behavior is becoming increasingly important for precise circuit simulations for designs utilizing SOI transistors. In particular, the floating body structure of SOI transistors have made the need for accurate SOI transistor body-effect models of critical importance.

However, using conventional SOI transistor test structures presents difficulties in making accurate measurements of the body-effect in SOI transistors. For example, one type of conventional SOI transistor test structure includes a semiconductor body having a doped halo region situated adjacent to a semiconductor body tie region. A gate is situated over the doped halo region of the semiconductor body and over a portion of the semiconductor body tie region. A heavily doped semiconductor body contact is situated within a portion of the semiconductor body tie region that extends beyond the gate, and a lightly doped semiconductor body portion is situated between the heavily doped semiconductor body contact and the doped halo.

To measure the body-effect using the conventional SOI transistor test structure, the voltage at the doped halo is varied by applying a voltage to the semiconductor body contact and the threshold voltage of the transistor is measured to determine the body-effect. However, since the heavily doped semiconductor body contact has substantially greater doping than the lightly doped semiconductor body portion, current flow between the heavily doped semiconductor body contact and the doped halo region of the semiconductor body can be impeded by a depletion region that can form in the lightly doped semiconductor body portion. As such, the voltage of the doped halo can differ significantly from the voltage applied to the heavily doped semiconductor body contact, resulting in erroneous threshold voltage measurements and inaccurate body-effect models.

SUMMARY

A silicon-on-insulator ("SOI") transistor test structure for measuring body-effect, substantially as shown in and/or described in connection with at least one of the figures, as set forth more completely in the claims.

DETAILED DESCRIPTION OF THE INVENTION

The present invention is directed to a silicon-on-insulator ("SOI") transistor test structure for measuring body-effect. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
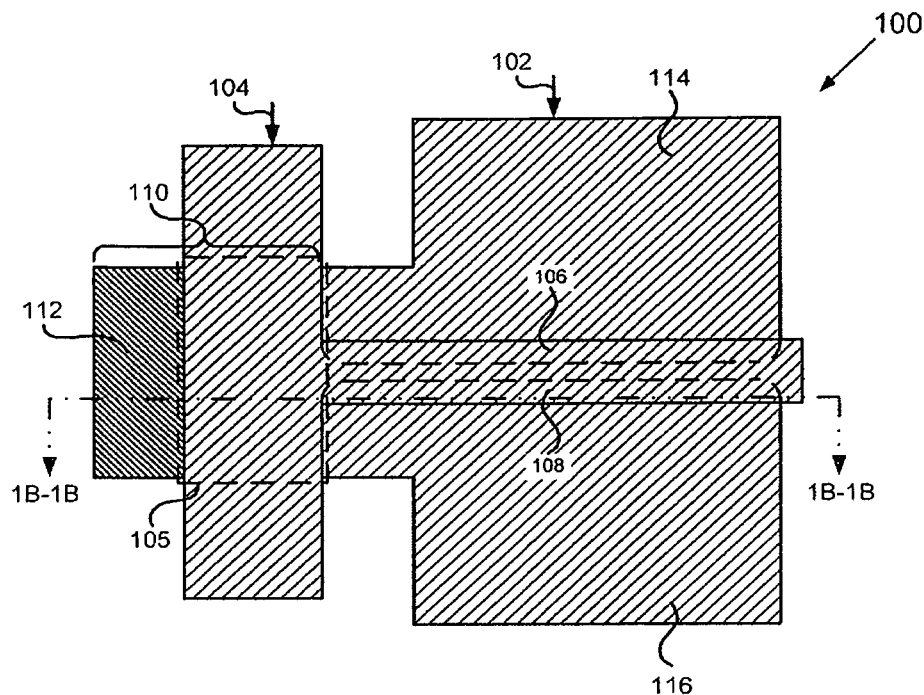
FIG. 1A illustrates a top view of a conventional silicon-on-insulator transistor test structure.

FIG. 1A shows a top view of test structure 100, which is one type of conventional silicon-on insulator ("SOI") transistor test structure. Certain details and features have been left out of FIG. 1, which are apparent to a person of ordinary skill in the art. As shown in FIG. 1, test structure 100 includes gate 104 situated over semiconductor body 102. Semiconductor body 102 includes doped halos 106 and 108 situated under gate 104, semiconductor body tie region 110, semiconductor body contact 112, and active source/drain regions 114 and 116.

Figure 1B:
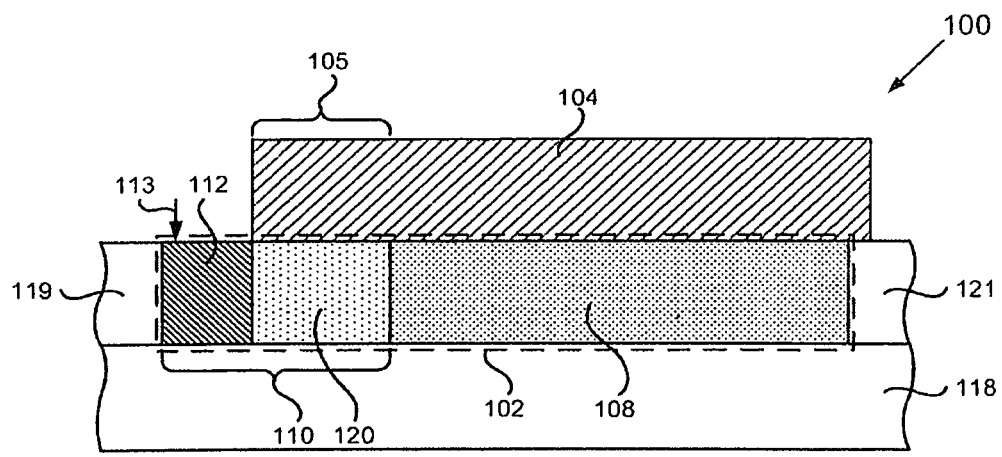
FIG. 1B illustrates a cross sectional view of a conventional silicon-on-insulator transistor test structure.

FIG. 1B shows a cross-sectional view of test structure 100 across line 1B-1B in FIG. 1A. In particular, semiconductor body 102, gate 104, doped halo 108, semiconductor body tie region 110 and semiconductor body contact 112 in FIG. 1B correspond to the same elements in FIG. 1A. As shown in FIG. 1B, semiconductor body 102 is situated over insulating layer 118 and can comprise, for example, silicon or other semiconductor material. Semiconductor body 102 can be formed, for example, using an epitaxial deposition process or other suitable deposition process. As further shown in FIG. 1B, gate 104 is situated over semiconductor body 102 and can comprise polycrystalline silicon (also referred to as polysilicon), which can be heavily doped with a suitable N type dopant, for example. Gate 104 can be formed, for example, using a low pressure chemical vapor deposition process ("LPCVD") or other suitable deposition process.

As shown in FIG. 1B, doped halo 108 in semiconductor body 102 is situated under gate 104 and adjacent to semiconductor body tie region 110. Doped halo 108 can be formed, for example, by doping the region of semiconductor body 102 under gate 104 with a suitable P type dopant, for example. As also shown in FIG. 1B, semiconductor body contact 112 in semiconductor body 102 is situated within a portion of semiconductor body tie region 110 which extends beyond gate 104. Semiconductor body contact 112 can be heavily doped, for example, with a suitable P type dopant and can include an ohmic contact (not shown in FIG. 1B) on top surface 113.

As further shown in FIG. 1B, semiconductor body portion 120 in semiconductor body tie region 110 is situated between and in electrical contact with semiconductor body contact 112 and doped halo 108. As shown in FIG. 1B, portion 105 of gate 104 situated over semiconductor body portion 120 prevents semiconductor body portion 120 from receiving an adequate level of doping when semiconductor body contact 112 is doped. Consequently, semiconductor body portion 120 is only lightly doped with a P type dopant such that semiconductor body portion 120 has less doping than semiconductor body contact 112 and doped halo 108.

Test structure 100 can be used to model and measure the body-effect of a floating body SOI transistor or a body tied SOI transistor by varying the voltage of doped halo 108 and determining the gate to source voltage, i.e. the threshold voltage, at which current begins to flow between the active source/drain regions 114 and 116 (shown in FIG. 1A). In test structure 100, the voltage of doped halo 108 can be controlled through semiconductor body tie portion 110 by applying a DC voltage to semiconductor body contact 112, which causes the voltage of doped halo 108 to approach the applied DC voltage. However, since semiconductor body portion 120 has substantially less doping than semiconductor body contact 112, a depletion region can form in semiconductor body portion 120, which can prevent or impede the flow of current from semiconductor body contact 112 to doped halo 108. Consequently, the voltage of doped halo 108 can differ significantly from the DC voltage applied to semiconductor body contact 112, resulting in erroneous threshold voltage measurements and inaccurate body-effect models.

Figure 2A:
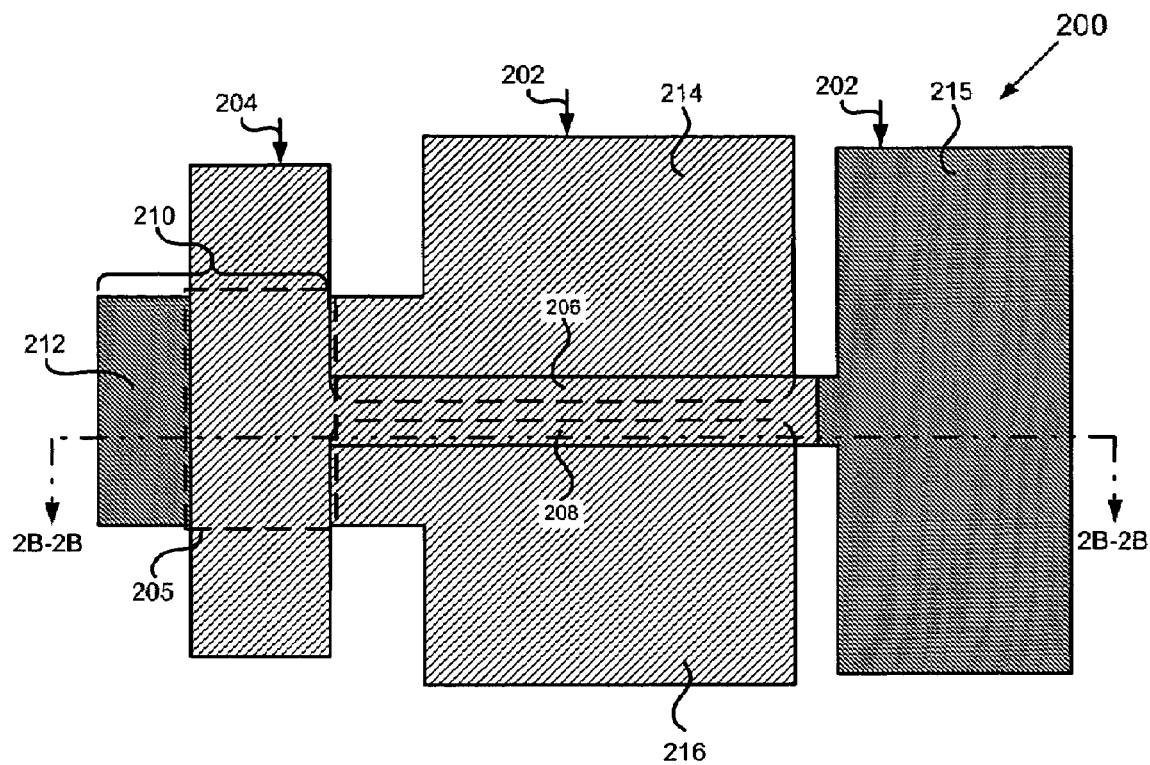
FIG. 2A illustrates a top view of a silicon-on-insulator transistor test structure, in accordance with one embodiment of the present invention.

FIG. 2A shows a top view of test structure 200, which is a silicon-on-insulator ("SOI") transistor test structure in accordance with one embodiment of the present invention. Certain details and features have been left out of FIG. 2A, which are apparent to a person of ordinary skill in the art. As shown in FIG. 2A, test structure 200 includes gate 204 situated over semiconductor body 202. Semiconductor body 202 includes doped halos 206 and 208 situated under gate 204, semiconductor body tie region 210, first semiconductor body contact 212, second semiconductor body contact 215, and active source/drain regions 214 and 216.

Figure 2B:
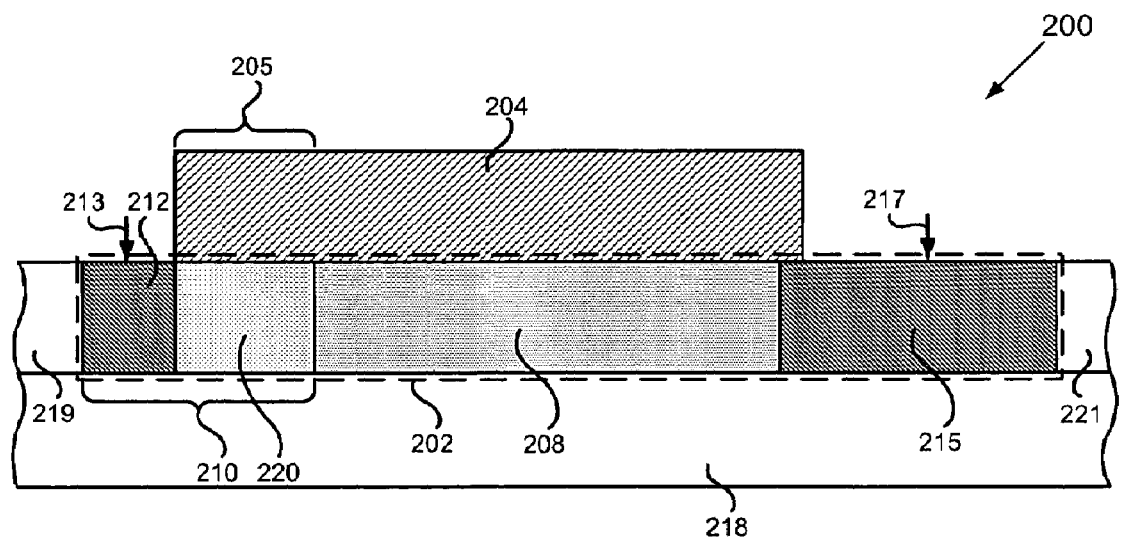
FIG. 2B illustrates a cross sectional view of a silicon-on-insulator transistor test structure, in accordance with one embodiment of the present invention.

FIG. 2B shows a cross-sectional view of test structure 200 across line 2B-2B in FIG. 2A. In particular, semiconductor body 202, gate 204, doped halo 208, semiconductor body tie region 210, first semiconductor body contact 212, and second semiconductor body contact 215 in FIG. 2B correspond to the same elements in FIG. 2A. As shown in FIG. 2B, semiconductor body 202 is situated over insulating layer 218 and can comprise, for example, silicon or other semiconductor material. Semiconductor body 202 can be formed, for example, using an epitaxial deposition process or other suitable deposition process. As further shown in FIG. 2B, gate 204 is situated over semiconductor body 202 and can comprise polycrystalline silicon (also referred to as polysilicon), which can be heavily doped with a suitable N type dopant, for example. Gate 204 can be formed, for example, using a low pressure chemical vapor deposition process ("LPCVD") or other suitable deposition process.

As shown in FIG. 2B, doped halo 208 in semiconductor body 202 is situated under gate 204 and adjacent to semiconductor body tie region 210. Doped halo 208 can be formed, for example, by doping the region of semiconductor body 202 under gate 204 with a suitable P type dopant, for example. As also shown in FIG. 2B, first semiconductor body contact 212 in semiconductor body 202 is situated within a portion of semiconductor body tie region 210 which extends beyond gate 204. First semiconductor body contact 212 can be heavily doped, for example, with a suitable P type dopant and can include an ohmic contact (not shown in FIG. 2B) on top surface 213.

As shown in FIG. 2B, semiconductor body portion 220 in semiconductor body tie region 210 is situated between and in electrical contact with first semiconductor body contact 212 and doped halo 208. As also shown in FIG. 2B, portion 205 of gate 204 situated over semiconductor body portion 220 prevents semiconductor body portion 220 from receiving an adequate level of doping when first semiconductor body contact 212 is doped. Consequently, semiconductor body portion 220 is only lightly doped with a P type dopant such that semiconductor body portion 220 has less doping than first semiconductor body contact 212 and doped halo 208.

According to the present invention, second semiconductor body contact 215 is situated adjacent to and in direct electrical contact with doped halo 208. Second semiconductor body contact 215 can be heavily doped, for example, with a suitable P type dopant and can include an ohmic contact (not shown in FIG. 2B) on top surface 217. It is noted that second semiconductor body contact 215 makes direct electrical contact with doped halo 208, whereas first semiconductor body contact 212 makes electrical contact with doped halo 208 through semiconductor body portion 220. In the embodiment of the invention shown in FIG. 2B, test structure 200 includes two semiconductor body contacts, i.e. first and second semiconductor body contacts 212 and 215, situated on opposing sides of doped halo 208. In other embodiments, more than two semiconductor body contacts can be used, so long as one or more of the semiconductor body contacts makes direct electrical contact with doped halo 208.

Test structure 200 can be used to accurately model the body-effect of a floating body SOI transistor or a body tied SOI transistor by accurately varying the voltage of doped halo 208 and accurately determining the gate to source voltage, i.e. the threshold voltage, at which electric current begins to flow between the active source/drain regions 214 and 216 (shown in FIG. 2A). In test structure 200, the voltage of doped halo 208 in test structure 200 can be accurately controlled through second semiconductor body contact 215 by applying a DC voltage to second semiconductor body contact 215, thereby causing the voltage of doped halo 208 to approach the applied DC voltage. Alternatively, the voltage of doped halo 208 can be accurately controlled by applying a DC voltage to both first and second semiconductor body contacts 212 and 215.

In contrast to conventional test structure 100 described above, second semiconductor body contact 215 forms a direct electrical contact with doped halo 208 since there is no intermediate lightly doped semiconductor body portion (such as lightly doped semiconductor body portion 220 between first semiconductor body contact 212 and doped halo 208) that would impede or prevent current flow between second semiconductor body contact 215 and doped halo 208. The direct electrical contact formed between second semiconductor body contact 215 and doped halo 208 in test structure 200 facilitates current flow from semiconductor body contact 215 to doped halo 208. As a result, the voltage of doped halo 208 will advantageously be much closer to the applied DC voltage in test structure 200 than in test structure 100. Therefore, test structure 200 provides a more accurate threshold voltage measurement for a given voltage of doped halo 208, thereby increasing the accuracy of the body-effect model.

Figure 3:
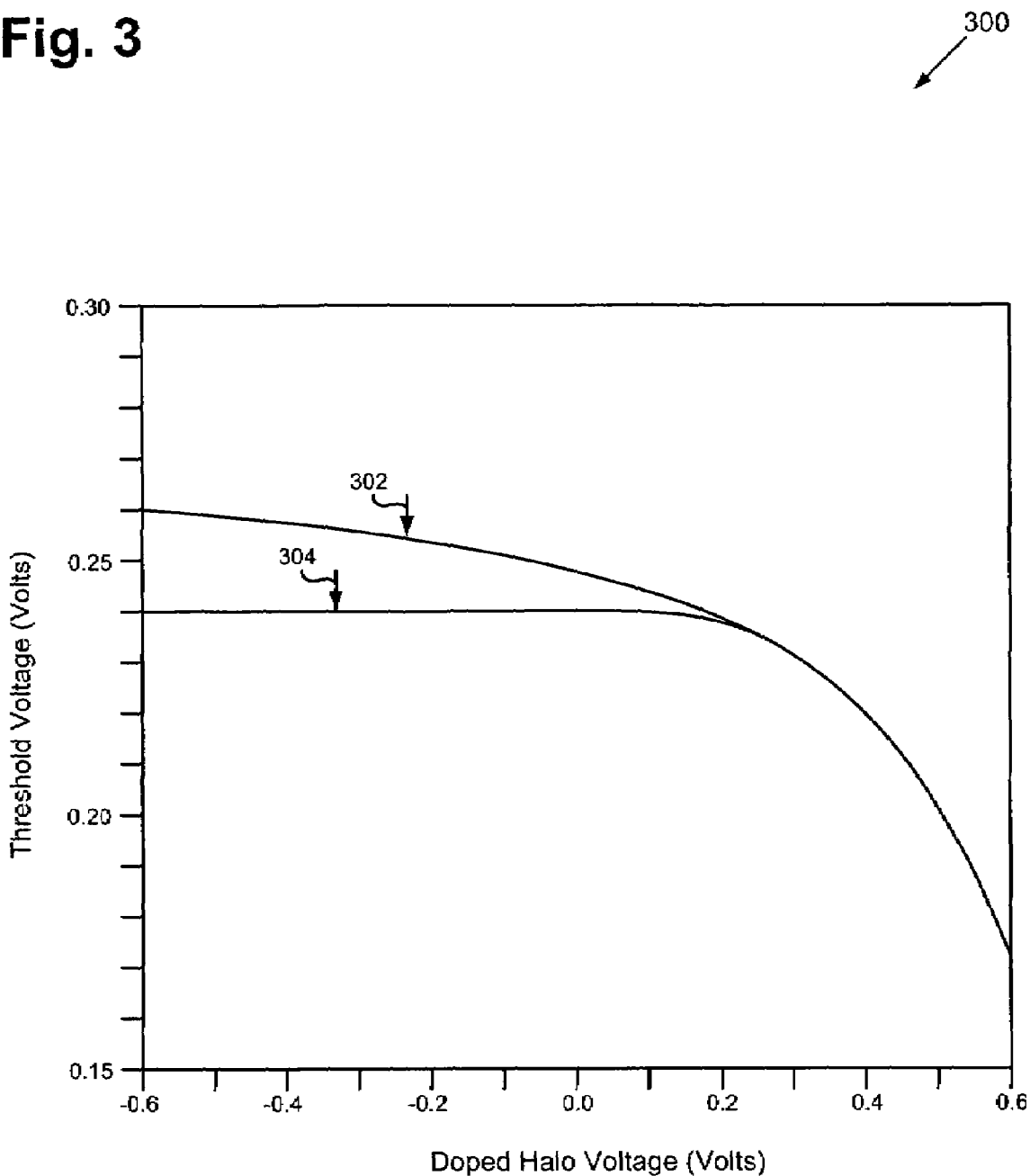
FIG. 3 shows a plot comparing body-effect measurements in accordance with one embodiment of the present invention.

An example of the increased accuracy in body-effect measurement provided by the invention is shown in exemplary plot 300 of FIG. 3. In plot 300, the y-axis represents threshold voltage in volts and the x-axis represents doped halo voltage in volts. Curve 302 represents the relationship between doped halo voltage and threshold voltage as measured by the invention's test structure 200 while curve 304 represents the relationship between doped halo voltage and threshold voltage as measured by conventional test structure 100.

As shown in FIG. 3, curve 304 erroneously indicates low threshold voltages for doped halo voltages below 0.2V. Therefore, due to the depletion region that forms in semiconductor body portion 120 in test structure 100 (shown in FIG. 1B), the voltage of doped halo 108 differs significantly from the DC voltage applied to semiconductor body contact 112. As a result, test structure 100 provides inaccurate threshold voltage measurements and consequently, an inaccurate body-effect model. Curve 302, however, shows increased threshold voltages for doped halo voltages below 0.2V. Therefore, since current flow to doped halo 208 in invention's test structure 200 is facilitated by second semiconductor body contact 215, the voltage of doped halo 208 does not significantly differ from the DC voltage applied to semiconductor body contact 215. As such, the accuracy of the measured threshold voltage for a given doped halo voltage is increased by the invention, thereby increasing the accuracy of the body-effect model. Due to the improved accuracy of the body-effect model of transistors, the design and/or fabrication of transistor structures can be significantly improved. In other words, data obtained from the invention's test structure and method, and the resulting improved body-effect model, can be utilized to aid engineers to appropriately account for body-effect related phenomena, such as threshold voltage changes, so as to significantly improve the design and/or fabrication of transistor structures.

Figure 4:
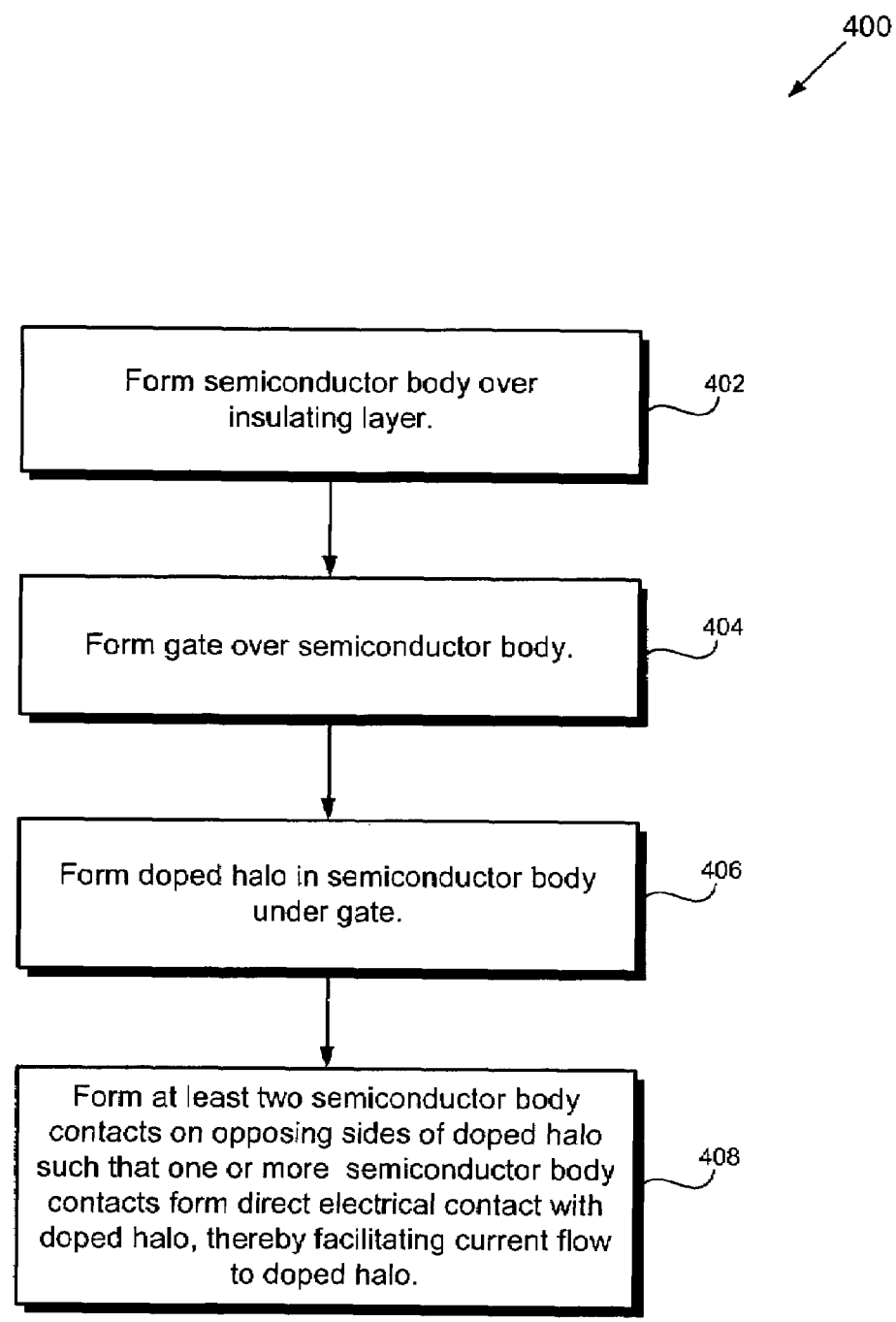
FIG. 4 is a flowchart illustrating steps taken to implement one embodiment of the present invention.

FIG. 4 shows a flowchart illustrating an exemplary method according to an embodiment of the present invention. Certain details and features have been left out of flowchart 400 that are apparent to a person of ordinary skill in the art. For example, a step may consist of one or more substeps or may involve specialized equipment or materials, as known in the art.

Referring now to step 402 of flowchart 400 in FIG. 4, semiconductor body 202 in FIG. 2B can be formed over an insulating layer. For example, semiconductor body 202 in FIG. 2B can be formed using an epitaxial deposition process or other suitable deposition process. At step 404 of flowchart 400, gate 204 is formed over semiconductor body 202. Gate 204, which can comprise N type polysilicon, can be deposited in an LPCVD process, for example. At step 406 of flowchart 400, doped halo 208 is formed in semiconductor body 202 under gate 204. For example, doped halo 208 can be formed by doping semiconductor body 202 under gate 204 with a suitable P type dopant. At step 408 of flowchart 400, at least two semiconductor body contacts, for example, semiconductor body contacts 212 and 215, are formed on opposing sides of doped halo 208 such that one or more of the at least two semiconductor body contacts forms a direct electrical contact with doped halo 208. For example, the semiconductor body contacts can be formed by heavily doping semiconductor body 202 with a suitable P type dopant. According to the invention, accurate body-effect related measurements can then be made utilizing test structure 200, as discussed above.

As explained above, since current flow to doped halo 208 in invention's test structure 200 is facilitated by semiconductor body contact 215, the voltage of doped halo 208 does not significantly differ from the DC voltage applied to semiconductor body contact 215. As such, the accuracy of the measured threshold voltage for a given doped halo voltage is increased by the invention, thereby increasing the accuracy of the body-effect model. Due to the improved accuracy of the body-effect model of transistors, the design and/or fabrication of transistor structures can be significantly improved. In other words, data obtained from the invention's test structure and method, and the resulting improved body-effect model, can be utilized to aid engineers to appropriately account for body-effect related phenomena, such as threshold voltage changes, so as to significantly improve the design and/or fabrication of transistor structures.

Figure 5:
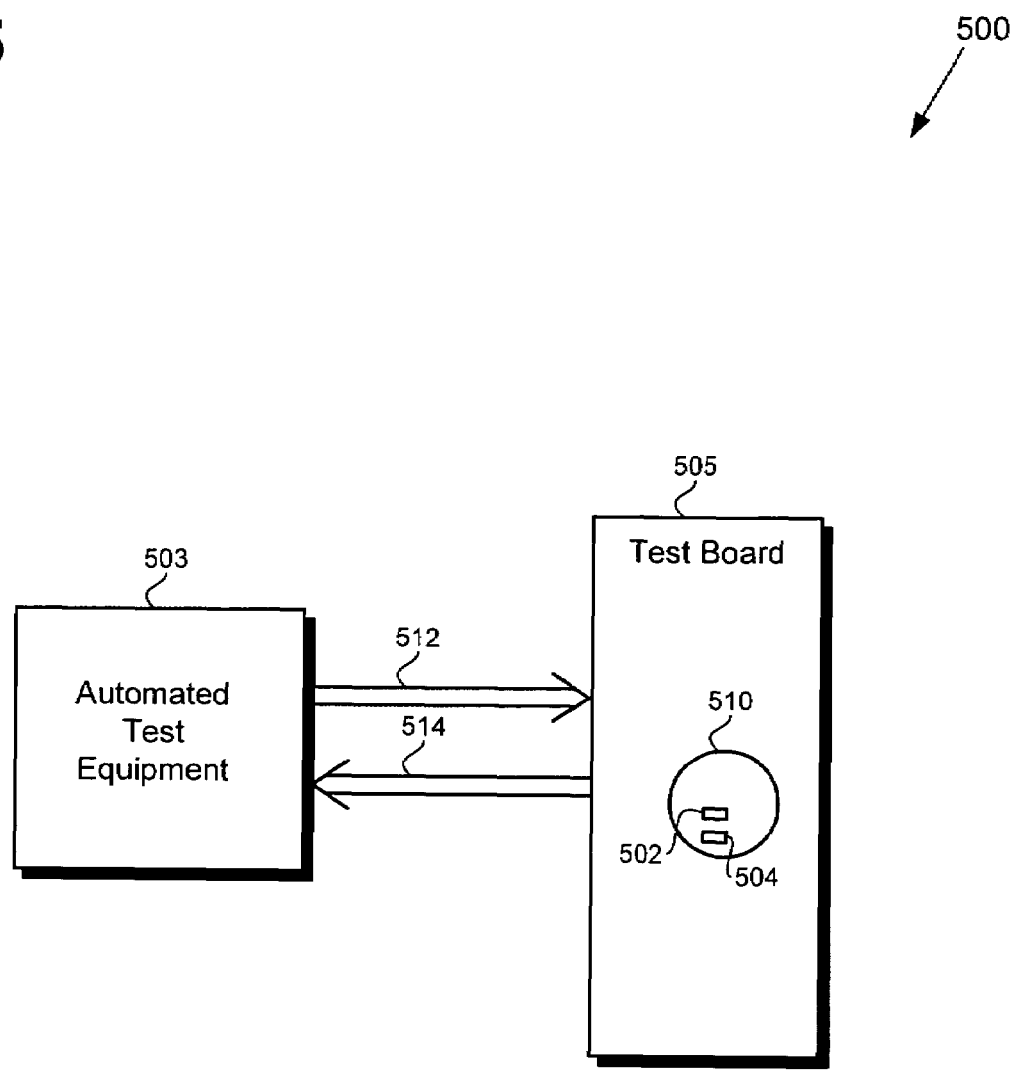
FIG. 5 shows an exemplary test system including an exemplary wafer under test having multiple exemplary transistor test structures in accordance with one embodiment of the invention.

FIG. 5 shows how an embodiment of the invention's test structure can be utilized for accurately measuring body-effect in SOI transistors. FIG. 5 shows an exemplary test system including an exemplary wafer under test including multiple exemplary SOI transistor test structures in accordance with one embodiment of the present invention. Test system 500 includes automated (i.e. computerized) test equipment 503 and test board 505. Test board 505 includes wafer under test 510, which can include test structures 502 and 504. Wafer under test 510 can also include additional test structures (not shown in FIG. 5), which are similar to test structures 502 and 504.

As shown in FIG. 5, test board 505 is coupled to automated test equipment 503 by buses 512 and 514. Test board 505 can include a number of interconnect traces (not shown in FIG. 5) to couple signals to and from automated test equipment 503 to the appropriate contact points or contact pads on each test structure on wafer under test 510. In the present embodiment, wafer under test 510 is mounted on test board 505. In an alternative embodiment, wafer under test 510 may not be mounted on test board 505, and may be connected directly to automated test equipment 503 via a number of probes and buses 512 and 514.

Automated test equipment 503 is configured to apply a suitable voltage to, for example, doped halo 208 of test structure 200 through semiconductor body contacts, such as first and second semiconductor body contacts 212 and 215 of test structure 200. Automated test equipment 503 is also configured to measure the threshold voltage of transistor test structure 200 in response to each voltage applied to doped halo 208 of test structure 200. As such, automated test equipment 503 can be utilized to accurately measure body-effect in the invention's transistor test structures.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a silicon-on-insulator ("SOI") transistor test structure for measuring body-effect has been described.

The invention claimed is:

1. A silicon-on-insulator (SOI) transistor test structure comprising:

a gate situated over a semiconductor body and over a doped halo;

at least two semiconductor body contacts situated on opposing sides of said doped halo, wherein one or more of said at least two semiconductor body contacts adjoins said doped halo directly under said gate and forms a direct electrical contact with said doped halo underlying said gate, thereby increasing current flow to said doped halo to facilitate measuring body-effect in said transistor test structure.

2. The transistor test structure of claim 1 wherein said doped halo is doped with a P type dopant.

3. The transistor test structure of claim 1 wherein said at least two semiconductor body contacts are heavily doped with a P type dopant.

4. The transistor test structure of claim 1 wherein a portion of said semiconductor body situated between at least one of said at least two semiconductor body contacts and said doped halo is lightly doped with a P type dopant.

5. The transistor test structure of claim 1 wherein said gate comprises polysilicon.

6. The transistor test structure of claim 1 wherein said gate is heavily doped with an N type dopant.

7. A test system comprising at least one test structure, said at least one test structure comprising:
a gate situated over a semiconductor body and a doped halo under said gate;
at least two semiconductor body contacts situated on opposing sides of said doped halo, wherein one or more of said at least two semiconductor body contacts adjoins said doped halo directly under said gate and forms a direct electrical contact with said doped halo underlying said gate, thereby increasing current flow to said doped halo to facilitate measuring body-effect in said transistor test structure.

8. The test system of claim 7 wherein said doped halo is doped with a P type dopant.

9. The test system of claim 7 wherein said at least two semiconductor body contacts are heavily doped with a P type dopant.

10. The test system of claim 7 wherein a portion of said semiconductor body situated between at least one of said at least two semiconductor body contacts and said doped halo is lightly doped with a P type dopant.

11. The test system of claim 7 wherein said gate is heavily doped with an N type dopant.

* * * * *